United States Patent
Ohkoshi et al.

(10) Patent No.: US 8,072,365 B2
(45) Date of Patent: Dec. 6, 2011

(54) MAGNETIC CRYSTAL FOR ELECTROMAGNETIC WAVE ABSORBING MATERIAL AND ELECTROMAGNETIC WAVE ABSORBER

(75) Inventors: Shin-ichi Ohkoshi, Tokyo (JP); Shiro Kuroki, Mishima (JP); Shunsuke Sakurai, Yokohama (JP); Asuka Namai, Tsukuba (JP); Kimitaka Sato, Okayama (JP); Shinya Sasaki, Okayama (JP)

(73) Assignees: The University of Tokyo, Tokyo (JP); DOWA Electronics Materials Co., Ltd., Tokyo (JP)

( * ) Notice: Subject to any disclaimer, the term of this patent is extended or adjusted under 35 U.S.C. 154(b) by 71 days.

(21) Appl. No.: 12/310,525

(22) PCT Filed: Aug. 30, 2007

(86) PCT No.: PCT/JP2007/067351
§ 371 (c)(1),
(2), (4) Date: Feb. 27, 2009

(87) PCT Pub. No.: WO2008/029861
PCT Pub. Date: Mar. 13, 2008

(65) Prior Publication Data
US 2010/0238063 A1    Sep. 23, 2010

(30) Foreign Application Priority Data

Sep. 1, 2006 (JP) ................................ 2006-238363
Mar. 30, 2007 (JP) ................................ 2007-095445

(51) Int. Cl.
*H01Q 17/00* (2006.01)
*H01F 1/01* (2006.01)
*C04B 35/26* (2006.01)
*H05K 9/00* (2006.01)

(52) U.S. Cl. .................. 342/1; 252/62.51 R; 252/62.56; 252/62.57; 252/62.58

(58) Field of Classification Search .................. 342/1–4; 252/62.51 R–62.51 C; 428/357, 402–407, 428/411.1, 688, 689, 692.1, 693.1, 800, 826, 428/836, 836.1, 836.2, 846, 846.1, 846.6, 428/846.7
See application file for complete search history.

(56) References Cited

U.S. PATENT DOCUMENTS 4,023,174 A * 5/1977 Wright .............................. 342/4
(Continued)

FOREIGN PATENT DOCUMENTS

JP        11-354972        12/1999
(Continued)

OTHER PUBLICATIONS

S. Kuroki et al., "Control of Spin Reorientation Phenomenon in an epsilon-Fe2O3 Nanomagnet"; Digest of the 29th Annual Conference on Magnetics in Japan; 21pPS-16; p. 371; printed in the year 2005.*

(Continued)

*Primary Examiner* — Bernarr Gregory
(74) *Attorney, Agent, or Firm* — Clark & Brody

(57) ABSTRACT

Disclosed is a magnetic crystal for electromagnetic wave absorbing materials, having a structure of $\epsilon\text{-}M_xFe_{2-x}O_3$ with $0<x<1$, which has the same space group as that of an $\epsilon\text{-}Fe_2O_3$ crystal and which is derived from an $\epsilon\text{-}Fe_2O_3$ crystal by substituting a part of the Fe site therein with M. In this, M is a trivalent element having an effect of lowering the coercive force Hc of $\epsilon\text{-}Fe_2O_3$ crystal by the substitution. Concretely, the element M includes Al and Ga. An electromagnetic wave absorber having a packed structure of particles having such a substituent element M-added "M-substituted $\epsilon\text{-}Fe_2O_3$ crystal" as the magnetic phase may control the electromagnetic wave absorption peak frequency depending on the degree of substitution with the element M, and for example, the invention gives an electromagnetic wave absorber applicable to a 76 GHz band for on-vehicle radars.

12 Claims, 10 Drawing Sheets

U.S. PATENT DOCUMENTS

| | | | | |
|---|---|---|---|---|
| 4,118,704 A * | 10/1978 | Ishino et al. | ............ | 342/4 |
| 5,446,459 A * | 8/1995 | Kim et al. | ............ | 342/1 |
| 5,668,070 A * | 9/1997 | Hong et al. | ............ | 342/1 |
| 5,853,889 A * | 12/1998 | Joshi et al. | ............ | 342/1 |
| 5,965,056 A * | 10/1999 | Okuyama et al. | ............ | 252/62.59 |
| 7,101,488 B2 * | 9/2006 | Kobayashi et al. | ............ | 252/62.62 |
| 7,108,799 B2 * | 9/2006 | Kobayashi et al. | ............ | 252/62.62 |
| 7,708,902 B2 * | 5/2010 | Ohkoshi et al. | ............ | 252/62.58 |
| 7,781,082 B2 * | 8/2010 | Ohkoshi et al. | ............ | 428/836.2 |
| 2007/0218319 A1 * | 9/2007 | Ohkoshi et al. | ............ | 428/836.1 |
| 2008/0057352 A1 * | 3/2008 | Ohkoshi et al. | ............ | 428/846.7 |

FOREIGN PATENT DOCUMENTS

| | | |
|---|---|---|
| JP | 2004-179385 | 6/2004 |
| JP | 2005-005286 | 1/2005 |
| JP | 2005-57093 | 3/2005 |
| JP | 2005-120470 | 5/2005 |
| JP | 2006-097123 | 4/2006 |
| JP | 2007-269548 | 10/2007 |
| JP | 2007-281410 | 10/2007 |

OTHER PUBLICATIONS

S. Sakurai et al., "Large Coercive Field and Spin Reorientation Phenomenon in epsilon-Fe2O3 Nanorod"; Digest of the 29th Annual Conference on Magnetics in Japan; 21pPS-17; p. 372; printed in the year 2005.*

S. Sakurai et al., "Preparation of Magnetically Oriented epsilon-Fe2O3 Nanoparticles Exhibiting Large Coercive Field"; Digest of the 30th Annual Conference on Magnetics in Japan; 13pD-3; printed in the year 2006.*

S.I. Ohkoshi, "Synthesis and Magnetic Properties of a Nanorod-type of Iron Oxide"; printed in the journal "Ceramics," vol. 41, No. 4; p. 296-299; printed in the year 2006.*

J. Jin et al., "Giant Coercive Field of Nanometer-Sized Iron Oxide", *Adv. Mater.* (2004), 16, No. 1, Jan. 5, pp. 48-51.

J. Jin et al. "Formation of spherical and rod-shaped $\epsilon$-Fe$_2$O$_3$ nanocrystals with a large coercive field", *J. Mater. Chem* (2005), pp. 1067-1071.

S. Sakurai et al. "Reorientation Phenomenon in a Magnetic Phase of $\epsilon$-Fe$_2$O$_3$ Nanocrystal", *Journal of the Physical Society of Japan*, vol. 74, No. 7, Jul. 2005, pp. 1946-1949.

Hideo Kaneko and Motofumi Honma, *Magnetic Materials*, Maruzen, 1977, p. 123.

Edited by CSJ: The Chemical Society of Japan, CSJ: The Chemical Society of Japan Dai 86 Shunki Nenkai (2006) Koen Yokoshu I, Mar. 13, 2006, p. 511.

* cited by examiner (i) Example 9

(j) Control (k) Example 10

MAGNETIC CRYSTAL FOR ELECTROMAGNETIC WAVE ABSORBING MATERIAL AND ELECTROMAGNETIC WAVE ABSORBER

TECHNICAL FIELD

The present invention relates to a magnetic crystal comprising an $\epsilon$-$Fe_2O_3$-based iron oxide, which is a magnetic crystal suitable for electromagnetic wave absorbers for use in a high-frequency band of 25 GHz or more, as well as to an electromagnetic wave absorbing material and an electromagnetic wave absorber comprising it.

PRIOR ART

Recently, with advancement of the information and communication technology, electromagnetic waves in various frequency bands have come to be used in popular applications. For example, there may be mentioned mobile telephones, wireless LAN, satellite broadcasting, intelligent transport systems, nonstop electronic toll collection systems (ETC), advanced cruise-assist highway systems (AHS), etc. With such diversification of electromagnetic wave applications in high-frequency bands, there may occur various problems of trouble, error and malfunction owing to interference between electronic components, and measures for them may be important. As one measure, a method of absorbing unnecessary electromagnetic waves by the use of an electromagnetic wave absorber to thereby prevent electromagnetic wave reflection and invasion may be effective.

Especially these days, studies of car driving assist systems are being made energetically as one means of using electromagnetic waves, and development of on-vehicle radars for detecting informations such as distance between cars by the use of milli-waves in a 76 GHz band is promoted, and in particular, development of a material having an excellent electromagnetic wave absorbing capability in that band range is expected. In future, use of electromagnetic waves in a 100 GHz band zone and a further higher frequency band zone may be taken into consideration. For realizing this, it is indispensable to develop a material capable of expressing an electromagnetic wave absorbing capability in such a high-frequency band zone.

Heretofore, hexagonal ferrite particles are frequently used as those having an electromagnetic wave absorbing capability. For example, Patent Reference 1 shows an electromagnetic wave absorber comprising a magneto-plumbite hexagonal ferrite of $BaFe_{(12-x)}Al_xO_{19}$ with x=0.6, which has an absorption peak at about 53 GHz. The reference says that use of the magneto-plumbite hexagonal ferrite of $BaFe_{(12-x)}Al_xO_{19}$ may control the ferromagnetic resonance frequency to fall between 50 and 100 GHz or so. However, there is shown no example that has realized an electromagnetic wave absorber exhibiting an excellent electromagnetic wave absorbing capability within a range of from 50 to 100 GHz, and a material having an absorption peak at any desired frequency within a range of from a high-frequency side to a low-frequency side is not provided.

Patent Reference 2 shows an electromagnetic wave absorber comprising a silicon carbide powder dispersed in a matrix resin, which has an absorption peak at around 76 GHz. However, the silicon carbide powder is expensive as a material for electromagnetic wave absorbers, though inexpensive as compared with silicon carbide fibers. In addition, as having electroconductivity, it must be processed for electric insulation when used in contact with other parts inside electronic appliances (around circuits).

Patent Reference 3 describes an electromagnetic wave absorber sheet comprising a dispersion mixture of a spongy iron powder having a specific surface area of at least 0.05 $m^2/g$, showing its examples having an electromagnetic wave absorption peak in a range of from 42 to 80 GHz. However, the absorption peak position changes, sensitively depending on the sheet thickness, and therefore the sheet thickness must be precisely defined to fall within a narrow range of from 0.2 to 5 mm in order to adjust the absorption peak position to a predetermined frequency in the above-mentioned frequency band zone. Since an iron powder is used, it may require a preparation for securing the corrosion resistance (oxidation resistance) of the sheet. Those having an absorption peak in a range over 80 GHz are not realized.

On the other hand, recent studies of iron oxide-based magnetic materials have confirmed the existence of $\epsilon$-$Fe_2O_3$ having an extremely large coercive force Hc of 20 kOe ($1.59 \times 10^6$ A/m). The most universal polymorphism of a composition of $Fe_2O_3$ having different crystal structures includes $\alpha$-$Fe_2O_3$ and $\gamma$-$Fe_2O_3$, and $\epsilon$-$Fe_2O_3$ is also another type thereof. The crystal structure and the magnetic property of $\epsilon$-$Fe_2O_3$ have been clarified just these days, as in Non-Patent References 1 to 3, in which an $\epsilon$-$Fe_2O_3$ crystal has come to be synthesized as an almost single-phase state thereof. $\epsilon$-$Fe_2O_3$ has an extremely large coercive force Hc, and is therefore expected to be applicable to high-recording-density magnetic recording media.

The electromagnetic wave absorbability of a magnetic material has correlation to the coercive force Hc thereof, and in general, the magnetic resonance frequency increases in proportion to the coercive force Hc, and therefore, it is said that, with the increase in the coercive force Hc, the electromagnetic wave absorption peak frequency tends to become high (Non-Patent Reference 4). The present inventors' studies have confirmed a high coercive force of $\epsilon$-$Fe_2O_3$, but there is known no report relating to the knowledge about the electromagnetic wave absorbability of $\epsilon$-$Fe_2O_3$ and the properties thereof.

[Patent Reference 1] JP-A 11-354972
[Patent Reference 2] JP-A 2005-57093
[Patent Reference 3] JP-A 2004-179385
[Non-Patent Reference 1] Jian Jin, Shinichi Ohkoshi and Kazuhito Hashimoto, ADVANCED MATERIALS 2004, 16, No. 1, January 5, pp. 48-51
[Non-Patent Reference 2] Jian Jin, Kazuhito Hashimoto and Shinichi Ohkoshi, JOURNAL OF MATERIALS CHEMISTRY 2005, 15, pp. 1067-1071
[Non-Patent Reference 3] Shunsuke Sakurai, Jian Jin, Kazuhito Hashimoto and Shinichi Ohkoshi, JOURNAL OF THE PHYSICAL SOCIETY OF JAPAN, Vol. 74, No. 7, July, 2005, pp. 1946-1949
[Non-Patent Reference 4] Hideo Kaneko and Motofumi Honma, MAGNETIC MATERIALS, Maruzen, 1977, p. 123

Problems that the Invention is to Solve

As mentioned above, it is not always easy to construct an electromagnetic wave absorber from inexpensive materials, capable of exhibiting excellent electromagnetic wave absorbability at a desired frequency in abroad frequency range including 76 GHz band for use for on-vehicle radars.

The present invention is to provide a novel iron oxide-based magnetic crystal capable of exhibiting excellent electromagnetic wave absorbability at a desired frequency in the above-mentioned broad frequency range, and to provide an electromagnetic wave absorber comprising it.

Means for Solving the Problems

As a result of detailed investigations, the present inventors have clarified that a magnetic crystal derived from an $\epsilon$-$Fe_2O_3$ crystal by substituting a part of the Fe site therein with a trivalent metal element can attain the above-mentioned object.

Specifically, the present invention provides a magnetic crystal for electromagnetic wave absorbing materials, having a structure of $\epsilon$-$M_xFe_{2-x}O_3$ with $0<x<1$, which has the same space group as that of an $\epsilon$-$Fe_2O_3$ crystal and which is derived from an $\epsilon$-$Fe_2O_3$ crystal by substituting a part of the Fe site therein with M. $\epsilon$-$M_xFe_{2-x}O_3$ derived from an $\epsilon$-$Fe_2O_3$ crystal by substituting a part of the Fe site therein with M may be hereinafter referred to as "M-substituted $\epsilon$-$Fe_2O_3$".

In this, as M, usable is one or more trivalent elements having an effect of lowering the coercive force Hc of the magnetic oxide comprising an $\epsilon$-$Fe_2O_3$ crystal (that is, $\epsilon$-$Fe_2O_3$ in which the Fe site is not substituted with the substituent element) by the above-mentioned substitution. Concretely, for example, M includes Al, Ga, In, etc. In case where M is Al, x in the composition of $\epsilon$-$M_xFe_{2-x}O_3$ may be within a range of, for example, from 0.2 to 0.8. In case where M is Ga, x may be within a range of, for example, from 0.1 to 0.8. In case where M is In, x may be within a range of, for example, from 0.01 to 0.3.

The M-substituted $\epsilon$-$Fe_2O_3$ magnetic crystal of the type may be produced, for example, according to a combined step of a reverse-micelle method and a sol-gel method followed by a baking step. It may also be produced according to a combined step of a direct production method and a sol-gel method followed by a baking step, as disclosed by the present patent applicants in Japanese Patent Application No. 2007-7518. The particles having the thus-produced magnetic crystal as the magnetic phase may have a mean particle size, as measured on a TEM (transmission electron microscope) picture thereof, falling within a range of from 5 to 200 nm. The particle fluctuation coefficient (standard deviation of particles/mean particle size) is within a range of less than 80%, and the particles are relatively fine and have a relatively uniform particle size. The invention provides an electromagnetic wave absorbing material that comprises a powder of such magnetic particles (that is, particles having the above-mentioned M-substituted $\epsilon$-$Fe_2O_3$ crystal as the magnetic phase). "Magnetic phase" as referred to herein means the part that carries the magneticity of the powder. "Having the M-substituted $\epsilon$-$Fe_2O_3$ crystal as the magnetic phase" means that the magnetic phase comprises the M-substituted $\epsilon$-$Fe_2O_3$ crystal, including a case where the magnetic phase contains magnetic crystal impurities inevitable in production.

The electromagnetic wave absorbing material of the invention may contain, as mixed therein, impurity crystals of an iron oxide that differs from the $\epsilon$-$Fe_2O_3$ crystal in point of the space group therebetween (concretely, crystals of $\alpha$-$Fe_2O_3$, $\gamma$-$Fe_2O_3$, FeO, $Fe_3O_4$ or those in which a part of Fe is substituted with any other element), as crystals constituting the magnetic phase or as non-magnetic crystals. However, the electromagnetic wave absorbing material of the invention comprises, as the main phase thereof, the above-mentioned "M-substituted $\epsilon$-$Fe_2O_3$ magnetic crystal". Specifically, the invention is targeted to such that the proportion of the "M-substituted $\epsilon$-$Fe_2O_3$ magnetic crystal" in the iron oxide crystals constituting the electromagnetic wave absorbing material is at least 50 mol % in terms of the molar ratio of the compound. The ratio of the existing crystals may be determined according to a Rietveld method based on an X-ray diffraction pattern. A non-magnetic compound such as silica ($SiO_2$) formed in the sol-gel step may adhere to the magnetic phase around it.

The invention also provides an electromagnetic wave absorber having a structure packed with the particles having the above-mentioned M-substituted $\epsilon$-$Fe_2O_3$ magnetic crystal as the magnetic phase. In particular, the invention provides one that has an electromagnetic wave absorption peak in a band zone range of from 25 to 160 GHz on a graph in which the horizontal axis indicates a frequency and the vertical axis indicates an electromagnetic wave absorption. By controlling the degree of substitution with M, the peak position of the electromagnetic wave absorption may be controlled to fall within a band range of 76 GHz±10 GHz, and in this case, an electromagnetic wave absorber suitable for on-vehicle radars can be constructed. In particular, as those having an electromagnetic wave absorption peak in a band zone range of from 40 to 160 GHz, there are provided an electromagnetic wave absorber having a packed structure of particles having the $\epsilon$-$M_xFe_{2-x}O_3$ magnetic crystal where M is Ga and x is from 0.1 to 0.65, as the magnetic phase, or electromagnetic wave absorber having a packed structure of particles having the magnetic crystal where M is Al and x is from 0.2 to 0.8, as the magnetic phase. For securing the packed structure of such particles, the packed structure is preferably so formed that the individual particles therein are bound to each other with a non-magnetic polymer compound serving as a binder.

The magnetic crystal of the invention may form in a simplified manner an electromagnetic wave absorber having an electromagnetic wave absorption peak at any desired position in a broad frequency region including a 76 GHz band for use for on-vehicle radars. The magnetic crystal may control the peak position of the electromagnetic wave absorption thereof, depending on the degree of substitution with the element M therein, and it has been confirmed that the magnetic crystal can realize an electromagnetic wave absorption peak even in a higher frequency region over 110 GHz.

PREFERRED EMBODIMENTS OF THE INVENTION

Figure 1A:
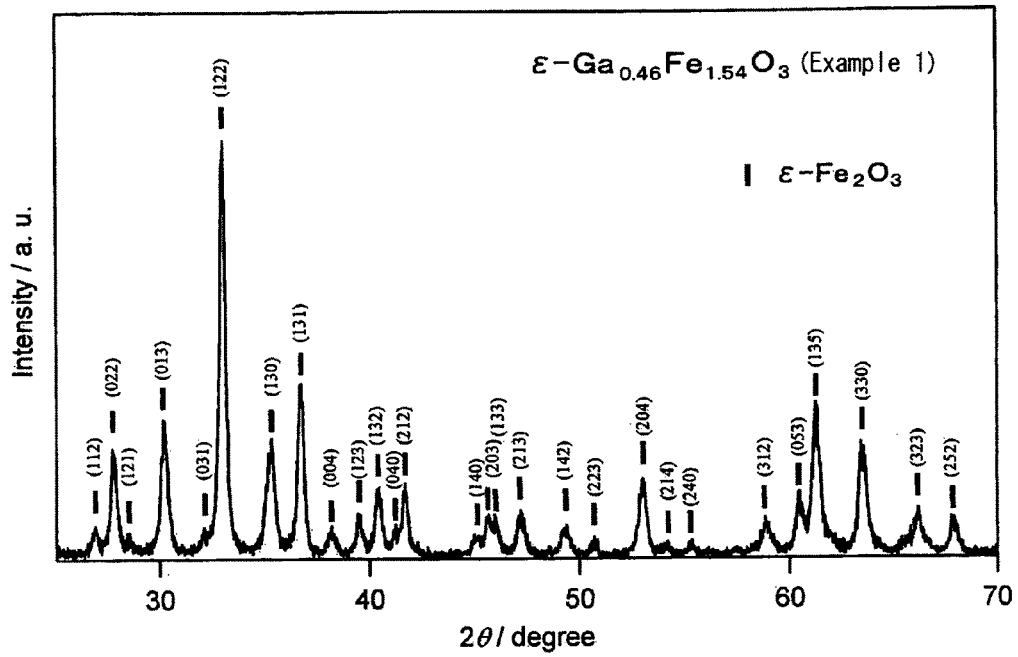
FIG. 1(a) is an X-ray diffraction pattern of a powder obtained in Example.

As described in Non-Patent References 1 to 3, a process comprising a combined step of a reverse micelle method and a sol-gel method followed by a heat-treatment (baking) step gives $\epsilon$-$Fe_2O_3$ nanoparticles. In the reverse micelle method, two micelle solutions each containing a surfactant, or that is, a micelle solution I (starting material micelle) and a micelle solution II (neutralizing agent micelle) are mixed to bring about iron hydroxide precipitation inside the micelles. Next, in the sol-gel method, the surfaces of the iron hydroxide particles formed inside the micelles are coated with silica. The iron hydroxide particles having the silica coat are separated from the liquid, and then subjected to heat treatment in an air atmosphere at a predetermined temperature (within a range of from 700 to 1300° C.). After the heat treatment, $\epsilon$-$Fe_2O_3$ crystal particles are obtained.

More concretely, the process is as follows:

In the aqueous phase of the micelle solution I that comprises n-octane as the oily phase, dissolved are iron nitrate as an iron source, an M nitrate as an M element source for substituting a part of iron (for Al, aluminium (III) nitrate 9-hydrate; for Ga, gallium(III) nitrate n-hydrate; for In, indium(III) nitrate 3-hydrate), and a surfactant (e.g., cetyltrimethylammonium bromide); and as the aqueous phase of the micelle solution II that comprises n-octane as the oily phase, used is an aqueous ammonia solution. In this case, a suitable amount of an alkaline earth metal (Ba, Sr, Ca, etc.) nitrate may be dissolved in the aqueous phase of the micelle solution I. The nitrate functions as a morphology controlling agent. Specifically, when an alkaline earth metal is made to exist in the liquid, rod-shaped M-substituted $\epsilon$-$Fe_2O_3$ crystal particles may be finally obtained. In the absence of the morphology controlling agent, nearly spherical M-substituted $\epsilon$-$Fe_2O_3$ crystal particles may be obtained.

Both the micelle solutions I and II are mixed, and then processed according to a sol-gel method. Concretely, while a silane (e.g., tetraethyl-orthosilane) is dropwise added to the combined liquid, this is kept stirred to promote the M element-containing iron hydroxide formation reaction inside the micelles. As a result, the surfaces of the fine iron hydroxide precipitate particles formed inside the micelles are coated with silica formed through hydrolysis of the silane. Next, the silica-coated, M element-containing iron hydroxide particles are separated from the liquid, washed and dried, and the resulting particulate powder is introduced into a furnace and heat-treated (baked) in air therein at a temperature falling within a range of from 700 to 1300° C., preferably from 900 to 1200° C., more preferably from 950 to 1150° C. The heat treatment promotes oxidation inside the silica coating, whereby the fine M element-containing iron hydroxide particles change to fine M-substituted $\epsilon$-$Fe_2O_3$ particles. During the oxidation, the silica coating participates not in formation of $\alpha$-$Fe_2O_3$ or $\gamma$-$Fe_2O_3$ crystals but in formation of M-substituted $\epsilon$-$Fe_2O_3$ crystals having the same space group as that of $\epsilon$-$Fe_2O_3$, and acts to prevent the particles from being sintered together. In case where a suitable amount of an alkaline earth metal exists in the system, the particles may grow into rod-shaped particles with ease.

For more economic production of M-substituted $\epsilon$-$Fe_2O_3$ crystals, also usable herein is the method disclosed by the present patent applicants in Japanese Patent Application No. 2007-7518. This is described briefly. First, to an aqueous medium with a trivalent iron salt and a substituent element (Ga, Al, etc.) salt dissolved therein, a neutralizing agent such as aqueous ammonia is added with stirring, whereby an iron hydroxide precursor (this may be partly substituted with any other element) is formed. Next, this is processed according to a sol-gel method to thereby form a silica coating layer on the surfaces of the precursor particles. The silica-coated particles are separated from the liquid, and then heat-treated (baked) at a predetermined temperature to give M-substituted $\epsilon$-$Fe_2O_3$ crystal particles.

The most universal polymorphism of a composition of $Fe_2O_3$ having different crystal structures includes $\alpha$-$Fe_2O_3$ and $\gamma$-$Fe_2O_3$, and also other iron oxides of FeO and $Fe_3O_4$. In production of the above-mentioned M-substituted $\epsilon$-$Fe_2O_3$, the $\epsilon$-$Fe_2O_3$ crystals may be in the form of a mixture with other iron oxide crystals (impurity crystals) that differ in point of the space group therebetween. The impurity crystals in the mixture may be acceptable within a range not interfering with the effect of the invention though they are unfavorable for making the M-substituted $\epsilon$-$Fe_2O_3$ crystals exhibit their characteristics to a higher level.

According to the detailed investigations made by the present inventors, the trivalent M element capable of readily controlling the coercive force Hc of the M-substituted $\epsilon$-$Fe_2O_3$ crystals depending on the degree of substitution with it includes Ga, Al and In. Using any of these elements as the substituent element M, the present inventors produced various M-substituted $\epsilon$-$Fe_2O_3$ crystals at a different degree of substitution, and analyzed them for their magnetic properties. The substituted crystals are expressed as $\epsilon$-$M_xFe_{2-x}O_3$, and the value x (that is, the degree of substitution with M) and the found data of the coercive force Hc are shown in Table 3. The M-substituted $\epsilon$-$M_xFe_{2-x}O_3$ crystals of different compositions were produced according to the process shown in Examples given hereinunder. When Ga, Al, In or the like is selected as the substituent element M, the behavior of the M-substituted $\epsilon$-$M_xFe_{2-x}O_3$ crystals is that the coercive force Hc thereof lowers with the increase in the degree of substitution with M.

With the reduction in the coercive force Hc, the electromagnetic wave absorption peak is shifted to the lower frequency side (see FIG. 6 mentioned below). In other words, depending on the degree of substitution with the element M, the peak frequency of the electromagnetic wave absorption can be controlled. For example, the electromagnetic wave absorber packed with particles that comprise substituent element-free $\epsilon$-$Fe_2O_3$ magnetic crystals as the magnetic phase (for example, having a thickness of from 2 to 10 mm) does not have an electromagnetic wave absorption peak within a detectable frequency region owing to the extremely large coercive force Hc of the magnetic particles (probably, it may have an electromagnetic wave absorption peak in a further higher frequency region); whereas the electromagnetic wave absorber packed with particles that comprise M-substituted $\epsilon$-Fe$_2$O$_3$ magnetic particles as the magnetic phase, in which a part of Fe is substituted with a suitable amount of an M element to lower the coercive force Hc thereof, actually showed an electromagnetic wave absorption peak in a range of 140 GHz or lower. Ordinary magnetic oxides are such that their electromagnetic wave absorption becomes almost zero at a frequency remoter than the electromagnetic wave absorption peak frequency. As opposed to these, magnetic oxides comprising $\epsilon$-Fe$_2$O$_3$ crystals or M-substituted $\epsilon$-Fe$_2$O$_3$ crystals exhibit a specific electromagnetic wave absorption behavior of such that they show a continuous electromagnetic wave absorption phenomenon in a broad frequency region even though deviating from the electromagnetic wave absorption peak frequency thereof.

A typical embodiment of the electromagnetic wave absorbing material that the invention provides is "magnetic powder" obtained according to the above-mentioned process. The powder comprises a powder having the above-mentioned M-substituted $\epsilon$-Fe$_2$O$_3$ magnetic crystals as the magnetic phase. The particle size of the particles may be controlled, for example, by controlling the heat-treatment (baking) temperature in the above-mentioned process. For use for electromagnetic wave absorbers, the magnetic powder may be expected to have enhanced absorbability when the particle size thereof is larger; however, at present, it is difficult to produce so large $\epsilon$-Fe$_2$O$_3$ particles. As a result of the present inventors' investigations, particles having a mean particle size, as measured on a TEM (transmission electron microscope) picture thereof (this is "TEM mean particle size" referred to hereinunder), of from 5 to 200 nm can be produced according to the process of the reverse micelle method combined with the sol-gel method as mentioned above, or according to the process of the direct production method combined with the sol-gel method as illustrated in Japanese Patent Application No. 2007-7518. Even such fine particles can construct practicable electromagnetic wave absorbers having a wave absorption of more than 20 dB, as shown in Examples given hereinunder. More preferably, the particle size of the individual particles is at least 10 nm, even more preferably at least 30 nm. A technique of extracting only $\epsilon$-Fe$_2$O$_3$ particles having a large particle size by classification is under investigation.

On the TEM picture, the particle size may be measured as follows: On a 600,000-power enlarged TEM picture image, the largest diameter of each particle (the major axis diameter of rod-shaped particles) is measured. Independent 300 particles are thus measured, and the mean value of the found data is the mean particle size of the powder. This is referred to as "TEM mean particle size".

Ideally, in the electromagnetic wave absorbing material of the invention, the magnetic phase is a single phase having a composition of a general formula $\epsilon$-M$_x$Fe$_{2-x}$O$_3$ with $0<x<1$, but as so mentioned in the above, the powder may contain impurity crystals ($\alpha$-Fe$_2$O$_3$, etc.) having a different crystal structure from the above, and they are acceptable within a range not interfering with the effect of the invention. Apart from these, the powder may further contain any other impurities inevitable in production and other elements optionally added thereto. To the particles constituting the powder, a non-magnetic compound or the like may adhere. These compounds in the powder are also acceptable within a range not interfering with the effect of the invention.

For example, in carrying out the process of the reverse micelle method as combined with the sol-gel method, a suitable amount of an alkaline earth metal ion added to the micelles facilitates final formation of rod-shaped crystals (as described in the above). The alkaline earth metal (Ba, Cr, Ca, etc.) added as a morphology controlling agent may remain in the surface layer part of the formed crystals, and therefore, the electromagnetic wave absorbing material of the invention may contain at least one such alkaline earth metal (hereinafter the alkaline earth metal element is represented by A). Its content is within a range of at most 20% by mass in terms of the proportion thereof represented by A/(M+Fe)×100; and the content of the alkaline earth metal of more than 20% by mass is, in general, unnecessary for the morphology controlling agent to exhibit its function. More preferably, the content is at most 10% by mass.

Further, the silica coating formed on the surfaces of the iron hydroxide particles in the sol-gel method may exist on the surfaces of the heat-treated (baked) powder particles. The non-magnetic compound such as silica, if any, on the surfaces of the powder particles may bring about some advantages in point of the handlability of the magnetic powder and in point of improving the durability, the weather resistance, the reliability and the like of the magnetic powder when used as magnetic materials for various applications. The non-magnetic compound having the function of the type includes other heat-resistant compounds such as alumina and zirconia, in addition to silica. However, too much adhesion of the non-magnetic compound is unfavorable as causing a problem of significant aggregation of the particles. As a result of various investigations, the amount of the non-magnetic compound, for example, silica SiO$_2$ is preferably at most 100% by mass in terms of the proportion thereof represented by Si/(M+Fe)×100. A part or most of silica adhering to the surfaces of the particles may be removed according to a method of dipping in an alkali solution. The adhering silica amount may be controlled to a desired level according to such a method.

In this description, a method for producing an M-substituted $\epsilon$-Fe$_2$O$_3$ crystal is described with reference to an example of producing its precursor, fine particles of iron hydroxide and an M hydroxide according to a reverse micelle method and a direct production method; however, apart from it, any other method is also employable that may produce a similar precursor having a size (this may be at most a few hundred nm) capable of being oxidized into an M-substituted $\epsilon$-Fe$_2$O$_3$ crystal. An example of silica coating by applying a sol-gel method to the precursor particles is described herein; however, the film formation method is not limited to the method exemplified herein but may be any other one in which the precursor may be coated with a heat-resistant film. For example, in a case where a heat-resistant film of alumina, zirconia or the like is formed on the surfaces of the precursor particles, it may be considered that the coated particles may be heated at a predetermined heat treatment temperature to give a powder of particles having an M-substituted $\epsilon$-Fe$_2$O$_3$ crystal as the magnetic phase.

The electromagnetic wave absorbing material (magnetic powder) of the invention may function as an electromagnetic wave absorber, when formed into a structure packed with the powder particles. The packed structure as referred to herein means that the particles are kept in contact with each other or kept in adjacent to each other and the particles constitute a three-dimensional structure in that condition. For practical use for an electromagnetic wave absorber, the magnetic powder must keep the packed structure. For this, for example, there may be mentioned a method of forming the packed structure by binding the individual particles to each other with a non-magnetic compound serving as a binder.

Concretely, a powder of the electromagnetic wave absorbing material of the invention is mixed with a non-magnetic polymer substrate to prepare a kneaded mixture. The blend ratio of the electromagnetic wave absorbing material powder in the kneaded mixture is preferably at least 60% by mass. The larger blend ratio of the electromagnetic wave absorbing material powder is more advantageous for improving the electromagnetic wave absorbing capability thereof; however, when too much, the powder may be difficult to mix and knead with the polymer substrate and attention must be paid thereto. For example, the blend ratio of the electromagnetic wave absorbing material powder may be from 80 to 95% by mass, or from 85 to 95% by mass.

As the polymer substrate, various substances capable of satisfying heat resistance, flame retardancy, durability, mechanical strength and electric characteristics may be usable depending on the environment for use thereof. For example, suitable ones may be selected from resins (nylon, etc.), gels (silicone gel, etc.), thermoplastic elastomers, rubbers and others. Two or more polymer compounds may be blended to be the substrate.

For improving the compatibility and the dispersibility with the polymer substrate, the electromagnetic wave absorbing material powder may be previously surface-treated with a surface-treating agent (silane coupling agent, titanate coupling agent, etc.). In mixing the electromagnetic wave absorbing material powder and the polymer substrate, various additives such as plasticizer, reinforcing agent, heat resistance improver, thermoconductive filler, adhesive and others may be added thereto.

The above kneaded mixture is rolled and shaped into a sheet having a predetermined thickness, thereby giving an electromagnetic wave absorber that keeps the packed structure as such. In place of rolling, the kneaded mixture may be injection-molded into an electromagnetic wave absorber article having a desired shape. A powder of the electromagnetic wave absorbing material of the invention may be mixed with a coating agent, and the mixture may be applied onto the surface of a substrate, thereby constructing an electromagnetic wave absorber that keeps the packed structure as such.

EXAMPLES

Example 1

This Example is to demonstrate production of a crystal having a composition of $\epsilon\text{-Ga}_{0.46}\text{Fe}_{1.54}\text{O}_3$ using Ga as the substituent element M. This is according to the process mentioned below.
[Step 1]
Two types of micelle solutions, micelle solution I and micelle solution II are prepared.
Preparation of Micelle Solution I:
6 mL of pure water, 18.3 mL of n-octane and 3.7 mL of 1-butanol are put into a Teflon® flask. 0.002295 mol of iron (III) nitrate 9-hydrate and 0.000705 mol of gallium(III) nitrate n-hydrate are added thereto and dissolved with sufficiently stirring at room temperature. Further, a surfactant cetyltrimethylammonium bromide is added in an amount to give a molar ratio of pure water/surfactant of 30, and dissolved by stirring, thereby giving a micelle solution I. In this, gallium(III) nitrate n-hydrate is a reagent having a purity of 99.9% and n of from 7 to 9, produced by Wako Pure Chemical Industries; and before its use herein, the reagent was quantitatively analyzed to identify n, and its amount to be fed was computed.

Regarding the feeding composition, the molar ratio of Ga to Fe is Ga/Fe=x/(2−x) where x=0.47.
Preparation of Micelle Solution II:
2 mL of aqueous 25% ammonia is mixed with 4 mL of pure water and stirred, and further, 18.3 mL of n-octane and 3.7 mL of 1-butanol are added to the liquid and well stirred. A surfactant cetyltrimethylammonium bromide is added to the solution in an amount to give a molar ratio of (pure water+ water in ammonia)/surfactant of 30, and dissolved to give a micelle solution II.
[Step 2]
With well stirring the micelle solution I, the micelle solution II is dropwise added to the micelle solution I. After the addition, the mixed liquid is kept stirred for 30 minutes.
[Step 3]
With stirring the mixed liquid obtained in the step 2, 1.0 mL of tetraethoxysilane (TEOS) is added to the mixed liquid. For about 1 day, this is kept stirred.
[Step 4]
The solution obtained in the step 3 is set in a centrifuge and centrifuged. The precipitate formed in this treatment is collected. The collected precipitate is washed a few times with a mixed solution of chloroform and methanol.
[Step 5]
The precipitate obtained in the step 4 is dried, and then heat-treated in a furnace having an air atmosphere at 1100° C. for 4 hours.
[Step 6]
The heat-treated powder obtained in the step 5 is stirred in an aqueous NaOH solution (2 mol/L) for 24 hours to thereby remove the silica probably existing on the particle surface. Next, this is filtered, washed with water and dried.

In the process of the above-mentioned steps 1 to 6, the intended sample (powder of electromagnetic wave absorbing material) was obtained. The production conditions are summarized in Table 1.

A TEM picture of the powder is shown in FIG. 3($a$). The TEM mean particle size was 33.0 nm, and the standard deviation was 17.3 nm. The fluctuation coefficient, as defined by (standard deviation/TEM mean particle size)×100, was 52.5%.

The obtained sample was analyzed through powdery X-ray diffractiometry (XRD: Rigaku's RINT 2000, with a ray source of CuKα ray, a voltage of 40 kV, a current of 30 mA), thereby giving a diffraction pattern shown in FIG. 1($a$). In this diffraction pattern, no other than the peaks corresponding to the crystal structure of $\epsilon\text{-Fe}_2\text{O}_3$ (ortho rhombic system, space group Pna2$_1$) was detected.

The obtained sample was analyzed through fluorescent X-ray analysis (JEOL's JSX-3220). When the molar ratio of Ga to Fe is represented by Ga/Fe=x/(2−x), x=0.47 in the feeding composition, but x=0.46 in the analyzed composition. Few iron oxide crystals of impurity were detected, and it may be considered that the obtained magnetic crystal could be almost a crystal having a composition of $\epsilon\text{-Ga}_{0.46}\text{Fe}_{1.54}\text{O}_3$.

Figure 4:
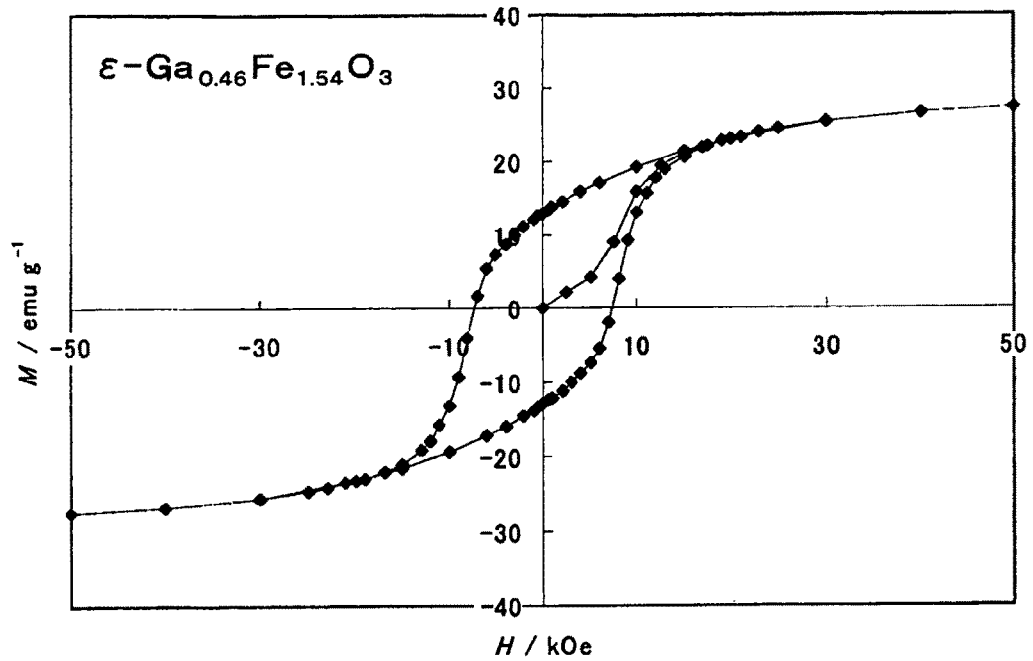
FIG. 4(a) is a magnetic hysteresis loop of the powder obtained in Example 1.
FIG. 4(b) is a magnetic hysteresis loop of the powder obtained in Control Example.
Figure 4:
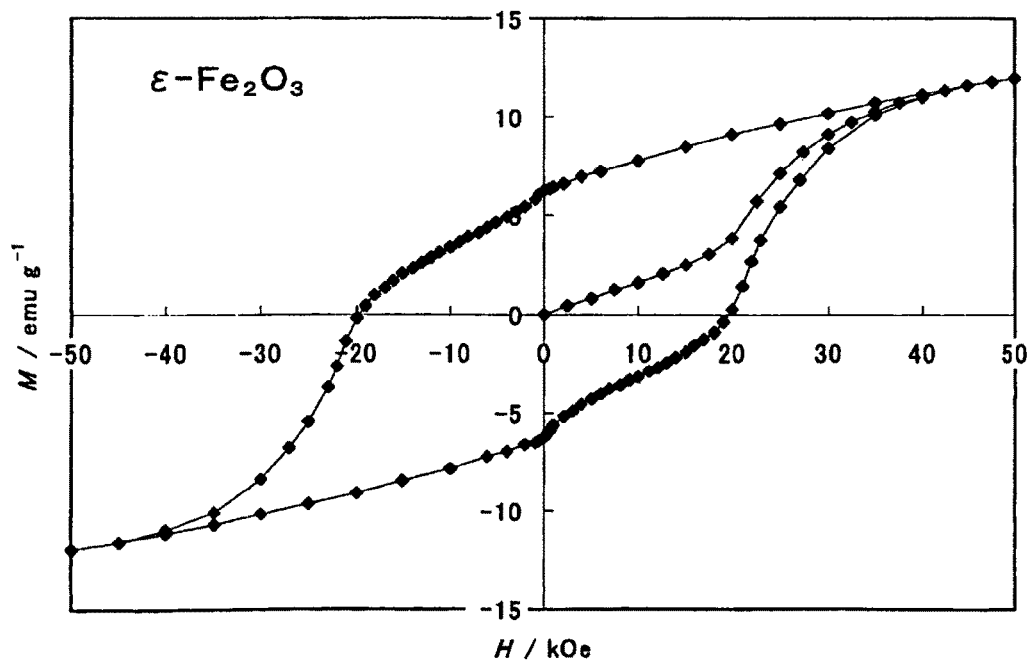

The obtained sample was analyzed for the magnetic hysteresis loop at room temperature (300K). The magnetic hysteresis loop is shown in FIG. 4($a$). The magnetic hysteresis loop was determined, using Quantum Design's superconducting quantum interference device, MPMS7, under the condition of a magnetic field of 70 kOe (5.57×10$^6$ A/m). The found magnetic moment data are standardized by mass of iron oxide. Supposing that all the elements Si, Fe and Ga in the sample could be in the form of $SiO_2$ and $Ga_x Fe_{2-x}O_3$ therein, the proportion of each element was determined according to the above-mentioned fluorescent X-ray analysis. The coercive force Hc under the test condition of the magnetic field of 70 kOe ($5.57 \times 10^6$ A/m) was 7.30 kOe ($5.81 \times 10^6$ A/m), and the saturation magnetization σs was 28.61 emu/g ($A \cdot m^2/kg$).

Figure 2A:
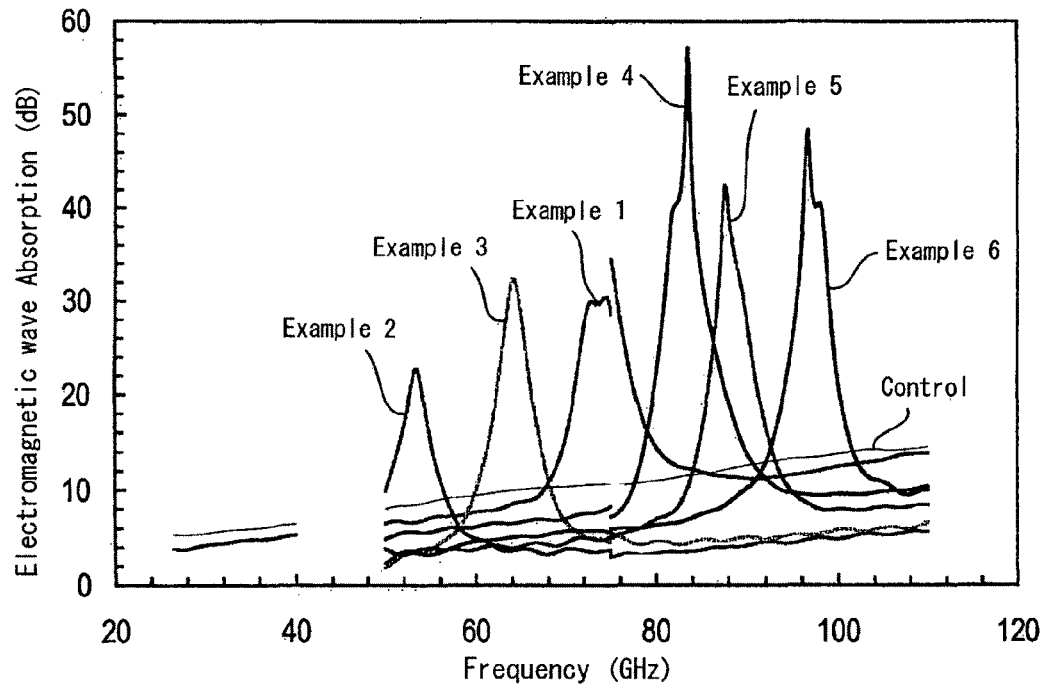
FIG. 2(a) is a graph showing the relationship between the frequency and the electromagnetic wave absorption of electromagnetic wave absorbers produced by the use of the powder obtained in Examples 1 to 6 and Control Example.

Next, the obtained sample was formed into a particles-packed structure, simulating an electromagnetic wave absorber having a thickness of 10 mm; and according to a free space method, its electromagnetic wave absorbing characteristics were determined. The free space method is a method for determining the electromagnetic wave absorbing characteristics of a sample by applying a plane wave to the sample put in a free space followed by measuring the S-parameter thereof under the condition. A quartz-made sample case capable of holding therein a powder in the form of a column having a diameter of 26.8 mm and a thickness of 10 mm was prepared, and 12.33 g of the above-mentioned sample powder was filled in the sample case to thereby form a columnar packed structure having a diameter of 26.8 mm and a thickness of 10 mm. The packed structure is herein referred to as "electromagnetic wave absorber sample". The electromagnetic wave absorber sample was put at the center between a transmitting antenna and a receiving antenna, an electromagnetic wave was applied to the sample vertically thereto, and the reflected wave and the transmitted wave (that is, the reflection coefficient $S_{11}$ and the transmission coefficient $S_{21}$) were determined. The energy absorption was computed as $1-|S_{11}|^2-|S_{21}|^2$, and this is expressed as the electromagnetic wave absorption (dB). The sample was analyzed in a band zone of from 25 to 110 GHz (with Ka band, V band, W band). The result is shown in FIG. 2(a).

Table 2 shows, as summarized therein, the analyzed composition and the properties of the obtained magnetic oxide of Ga-substituted $\epsilon$-$Fe_2O_3$ crystal.

Examples 2 to 6

Magnetic oxides of Ga-substituted $\epsilon$-$Fe_2O_3$ crystal were produced in the same manner as in Example 1, for which, however, the feeding composition of the micelle solution I in the step 1 was changed as in Table 1; and they were analyzed for the characteristics thereof in the same manner as in Example 1. All these Ga-substituted $\epsilon$-$Fe_2O_3$ crystals gave an X-ray diffraction pattern similar to FIG. 1(a). TEM pictures of these powders are shown in FIG. 3(b) to FIG. 3(f). The electromagnetic wave absorbing characteristics are shown in FIG. 2(a). Table 2 shows, as summarized therein, the analyzed composition and the properties of the magnetic oxides.

Examples 7 to 9

Figure 3A:
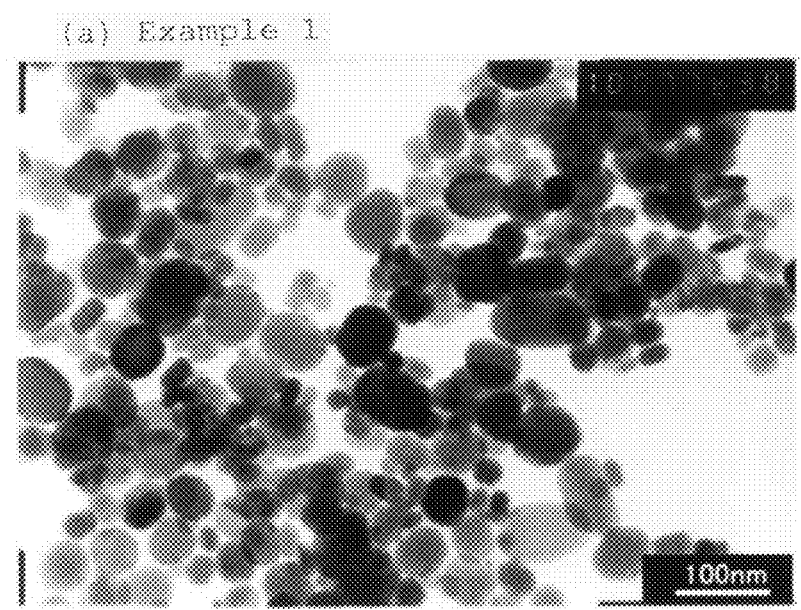
FIG. 3(a) is a TEM picture of the powder obtained in Example 1.
Figure 3B:
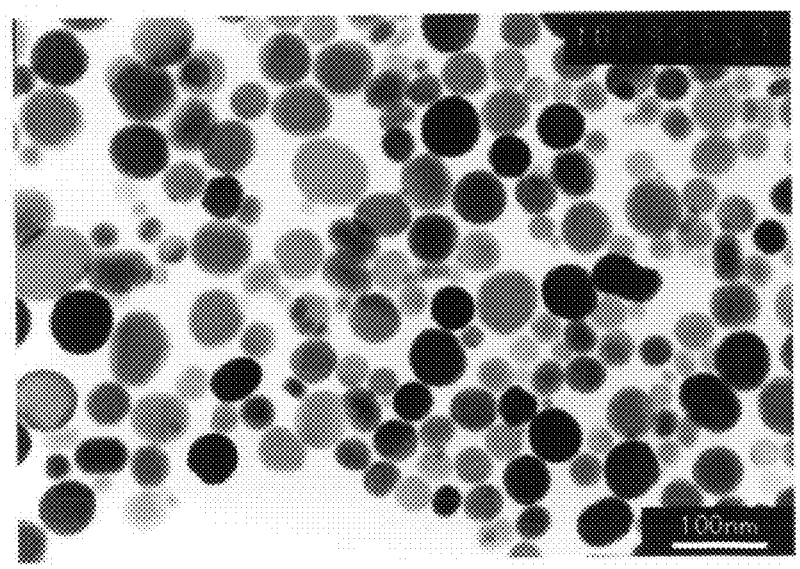
FIG. 3(b) is a TEM picture of the powder obtained in Example 2.
Figure 3C:
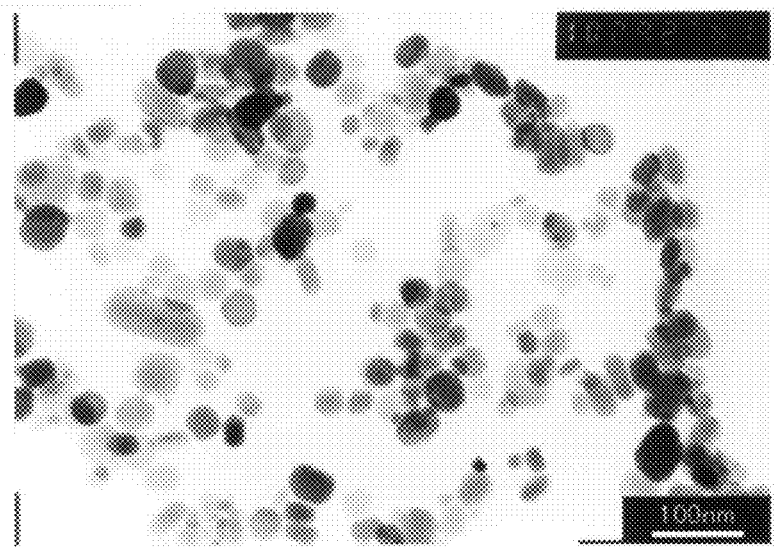
FIG. 3(c) is a TEM picture of the powder obtained in Example 3.
Figure 3D:
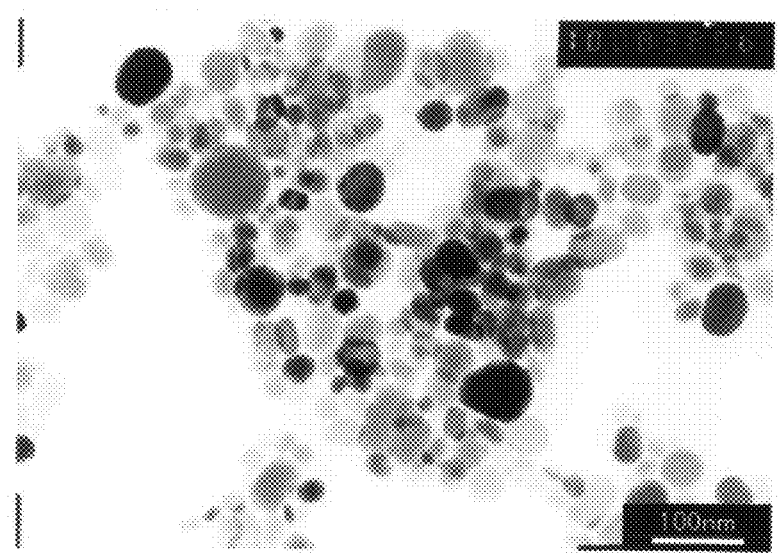
FIG. 3(d) is a TEM picture of the powder obtained in Example 4.
Figure 3E:
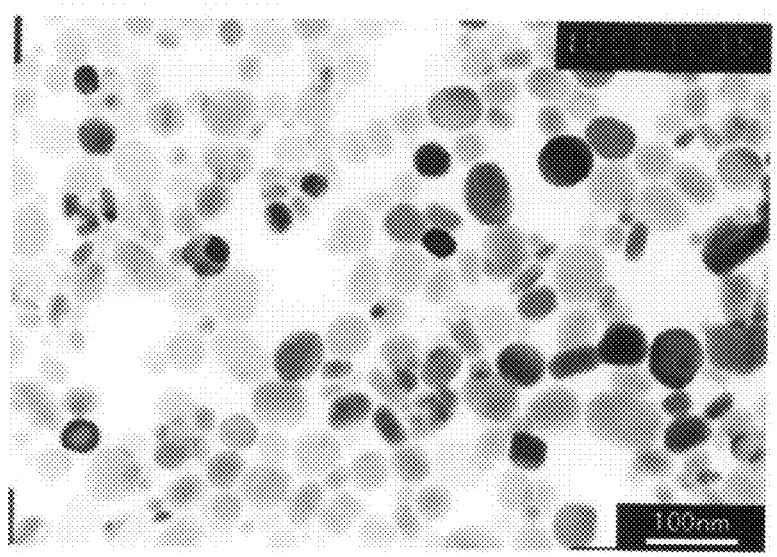
FIG. 3(e) is a TEM picture of the powder obtained in Example 5.
Figure 3F:
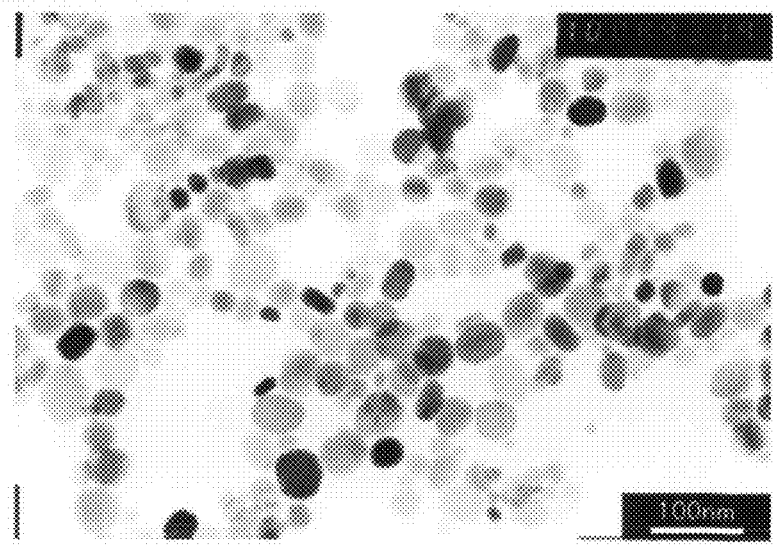
FIG. 3(f) is a TEM picture of the powder obtained in Example 6.
Figure 3G:
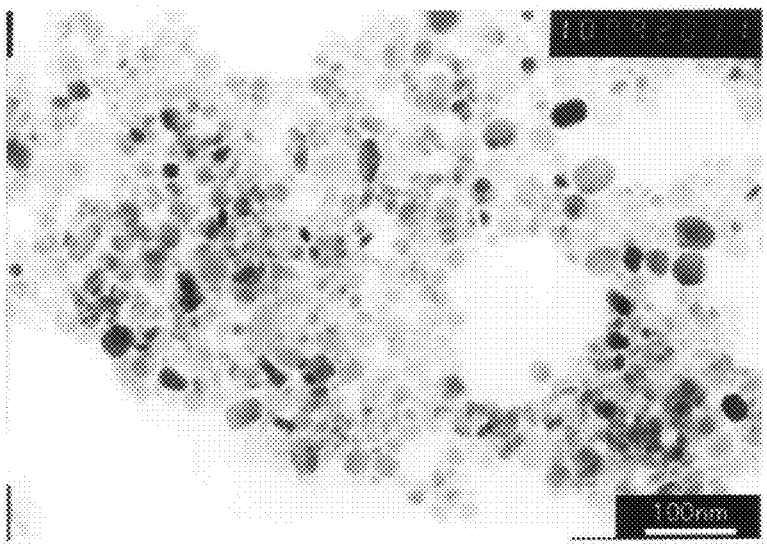
FIG. 3(g) is a TEM picture of the powder obtained in Example 7.
Figure 3H:
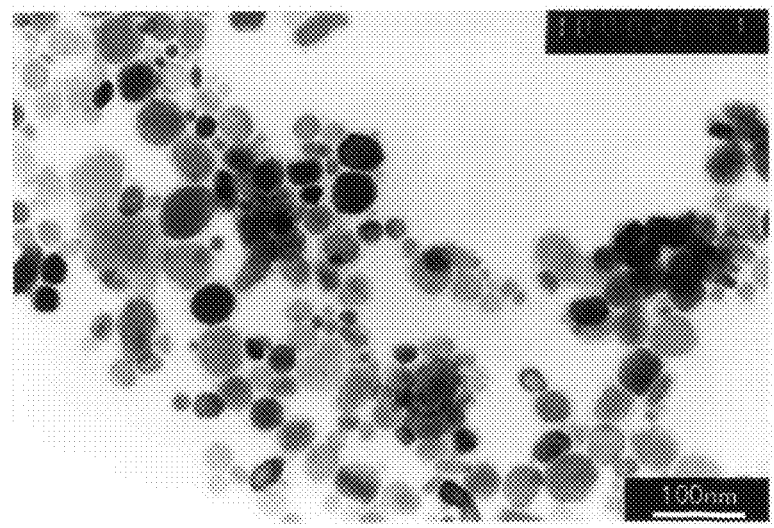
FIG. 3(h) is a TEM picture of the powder obtained in Example 8.
Figure 3I:
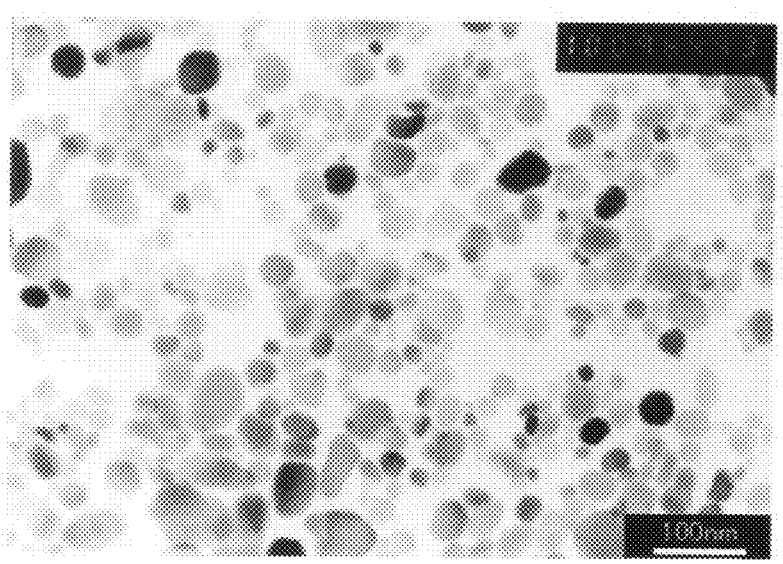
FIG. 3(i) is a TEM picture of the powder obtained in Example 9.

Magnetic oxides of Ga-substituted $\epsilon$-$Fe_2O_3$ crystal were produced in the same manner as in Example 1, for which, however, the feeding composition of the micelle solution I in the step 1 was changed as in Table 1. The obtained Ga-substituted $\epsilon$-$Fe_2O_3$ crystals gave an X-ray diffraction pattern similar to FIG. 1(a). TEM pictures of the obtained particles are shown in FIG. 3(g) to FIG. 3(i).

Figure 2B:
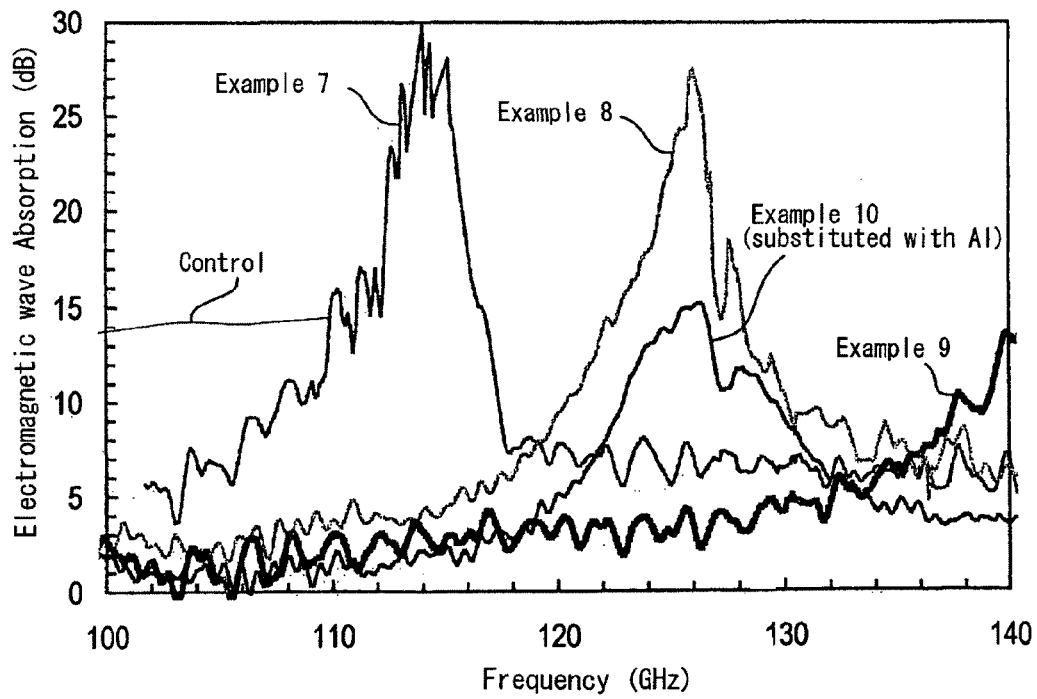
FIG. 2(b) is a graph showing the relationship between the frequency and the electromagnetic wave absorption of electromagnetic wave absorbers produced by the use of the powder obtained in Examples 7 to 10 and Control Example.

The oxide powder was filled in a paper cylinder having a diameter of 40 mm and a height of 10 mm, thereby forming a packed structure, which was analyzed for the electromagnetic wave absorbing characteristics thereof within a range of from 96 to 140 GHz. Using a network analyzer of from 8 GHz to 11.8 GHz and a 12-power upconverter, the above-mentioned high-frequency test was realized. The transmitting and receiving antennas are horn antennas. The results are shown in FIG. 2(b). Table 2 shows the analyzed composition and the characteristics of the magnetic oxides.

TABLE 1

| | | Step 1 | | | | | | | | | | | Step 2 | Step 3 | Step 5 | |
| | | Micelle Solution I | | | | | | Micelle Solution II | | | | | number | amount | baking | bak- |
| Example No. | x (note-1) | pure water (mL) | Fe nitrate (mmol) | Ga nitrate (mmol) | n-oc-tane (mL) | n-bu-tanol (mL) | CATB (mmol) | aqueous $NH_3$ (mL) | pure water (mL) | n-oc-tane (mL) | n-bu-tanol (mL) | CATB (mmol) | of revolution (rpm) | of TEOS (mL) | temper-ature (°C.) | ing time (h) |
|---|---|---|---|---|---|---|---|---|---|---|---|---|---|---|---|---|
| Example 1 | 0.47 | 6.00 | 2.295 | 0.705 | 18.50 | 3.7 | 9.659 | 2.0 | 4.0 | 18.50 | 3.7 | 9.659 | 1200 | 1.0 | 1100 | 4 |
| Example 2 | 0.63 | | 2.014 | 0.917 | | | | | | | | | | | | |
| Example 3 | 0.54 | | 2.147 | 0.786 | | | | | | | | | | | | |
| Example 4 | 0.40 | | 2.352 | 0.582 | | | | | | | | | | | | |
| Example 5 | 0.35 | | 2.426 | 0.509 | | | | | | | | | | | | |
| Example 6 | 0.30 | | 2.500 | 0.437 | | | | | | | | | | | | |
| Example 7 | 0.23 | | 2.628 | 0.342 | | | | | | | | | | | | |
| Example 8 | 0.15 | | 2.748 | 0.223 | | | | | | | | | | | | |
| Example 9 | 0.10 | | 2.822 | 0.148 | | | | | | | | | | | | |

(note-1) The molar ratio of Ga to Fe at their feeding is represented by Ga/Fe = x/(2 − x), and the value x is shown.

TABLE 2

| | | Analyzed Composition | | | Mean particle | Standard | Fluctuation | Magnetic Characteristics | | |
| | | | | | | | | Hc (note-3) | | |
| Example No. | x (note-1) | Fe (mass %) | Ga (mass %) | x (note-2) | Size (nm) | Deviation (nm) | Coefficient (%) | (kOe) | (kA/m) | Ms ($A^2m/kg$) |
|---|---|---|---|---|---|---|---|---|---|---|
| Example 1 | 0.47 | 52.8 | 20.0 | 0.46 | 33.0 | 17.3 | 52.5 | 7.3* | 580.9* | 29.2 |
| Example 2 | 0.63 | 47.0 | 25.5 | 0.61 | 39.0 | 16.4 | 42.0 | 4.7 | 374.0 | 23.3 |
| Example 3 | 0.54 | 46.0 | 21.5 | 0.54 | 33.1 | 14.4 | 43.3 | 5.5 | 437.7 | 25.4 |
| Example 4 | 0.40 | 56.5 | 18.0 | 0.41 | 31.2 | 16.1 | 51.6 | 8.8 | 700.3 | 30.1 |
| Example 5 | 0.35 | 51.4 | 13.6 | 0.35 | 33.4 | 16.2 | 48.4 | 9.3 | 740.1 | 28.7 |

TABLE 2-continued

| | | Analyzed Composition | | | Mean particle Size | Standard Deviation | Fluctuation Coefficient | Magnetic Characteristics | | |
|---|---|---|---|---|---|---|---|---|---|---|
| Example No. | x (note-1) | Fe (mass %) | Ga (mass %) | x (note-2) | (nm) | (nm) | (%) | Hc (note-3) | | Ms |
| | | | | | | | | (kOe) | (kA/m) | (A²m/kg) |
| Example 6 | 0.30 | 54.1 | 11.6 | 0.29 | 30.0 | 13.0 | 43.6 | 10.0 | 795.8 | 27.4 |
| Example 7 | 0.23 | 56.2 | 8.87 | 0.22 | 20.5 | 9.05 | 44.2 | 11.6 | 923.1 | 24.7 |
| Example 8 | 0.15 | 61.30 | 6.21 | 0.15 | 28.2 | 13.8 | 48.8 | 13.8 | 1098.2 | 16.0 |
| Example 9 | 0.10 | 65.00 | 4.21 | 0.10 | 23.7 | 11.3 | 47.7 | 16.0 | 1273.2 | 14.9 |
| Control Example | 0.00 | — | — | 0.00 | 34.8 | 28.9 | 83.1 | 19.7 | 1567.7 | 12.0 |

(note-1) The molar ratio of Ga to Fe at their feeding is represented by Ga/Fe = x/(2 − x), and the value x is shown.
(note-2) The molar ratio of Ga to Fe as the analyzed data of the obtained particles is represented by Ga/Fe = x/(2 − x), and the value x is shown.
(note-3) Samples with the mark * were tested in a magnetic field of 7T, and the others were in a magnetic field of 5T.

Example 10

A sample having a substituent element M of Al in place of Ga was produced. Concretely, in this, the feeding material for the micelle solution I in the step 1, gallium(III) nitrate n-hydrate was changed to aluminium (III) nitrate 9-hydrate; and the feeding composition was so controlled that the molar ratio of Al to Fe could be Al/Fe=x/(2−x) with x=0.30. The others were the same as in the process of Example 1, and accordingly, a magnetic oxide of Al-substituted $\epsilon$-$Fe_2O_3$ crystal was produced. From its X-ray diffraction pattern, the crystal was identified as the same as $\epsilon$-$Fe_2O_3$ crystal in point of the space group. A TEM picture of the obtained particles is shown in FIG. 3(k).

As a result of composition analysis, Fe was 46.0% by mass, Al was 4.43% by mass, and the degree of substitution by analysis was x=0.33.

The coercive force (Hc) of the magnetic oxide at 300K was 13 kOe, and the saturation magnetization (Ms) was 26.6 emu/g.

The oxide powder was formed into a packed structure, and its electromagnetic wave absorbing characteristics were determined. The test method is the same as in Examples 7 to 9. The test result is shown in FIG. 2(b).

As in FIG. 2(a) and FIG. 2(b), the electromagnetic wave absorber samples of Examples 1 to 8 and 10 had an electromagnetic wave absorption peak in a range of from 25 to 140 GHz. As compared with that of the control sample (substituent element-free $\epsilon$-$Fe_2O_3$) mentioned below, the coercive force Hc of these samples was lowered and, with that, the magnetic resonance frequency thereof was lowered, and it may be considered that the electromagnetic wave absorption peak of these samples would appear in a region not higher than 140 GHz.

Figure 5:
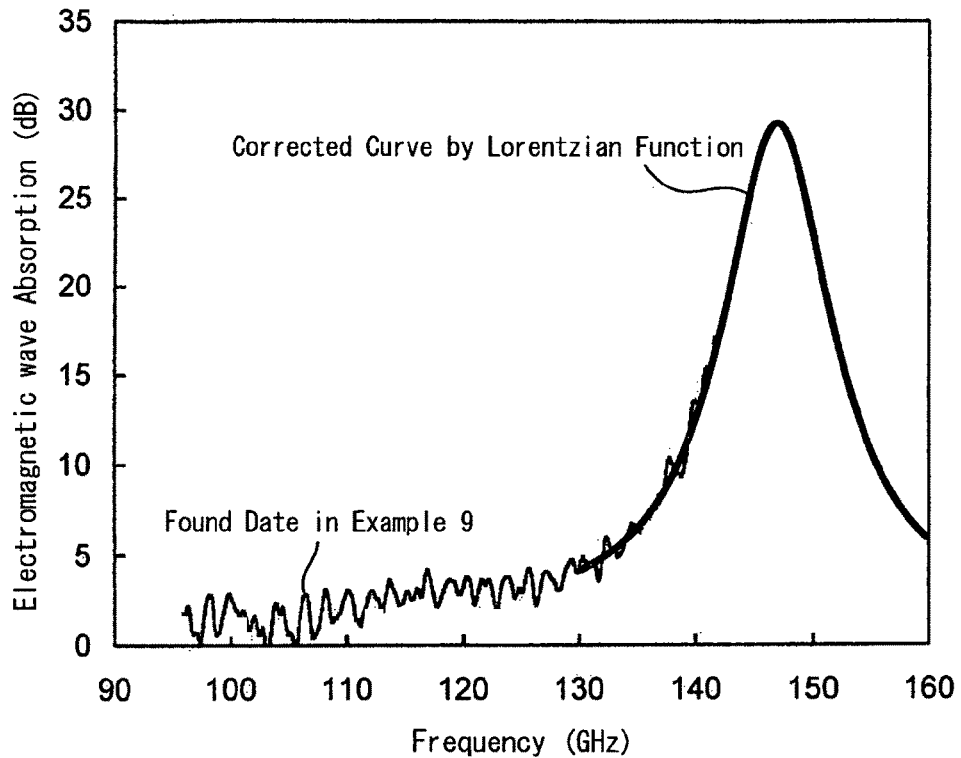
FIG. 5 is a graph showing a curve of the found data and a curve corrected by the Lorentzian function relative to the relationship between the frequency and the electromagnetic wave absorption in Example 9.

In Example 9, the sample behavior is that its electromagnetic wave absorption further increased even when the frequency was elevated up to 140 GHz (FIG. 2(b)). At present, a method of directly determining the electromagnetic wave absorbing characteristics on the higher frequency side is not established. Accordingly, the inventors tried estimating the resonance frequency by extrapolating the spectrum on the basis of the Lorentzian function. The result is shown in FIG. 5. This resulted in that the sample would have an electromagnetic wave absorption peak at around 147 GHz.

Figure 6:
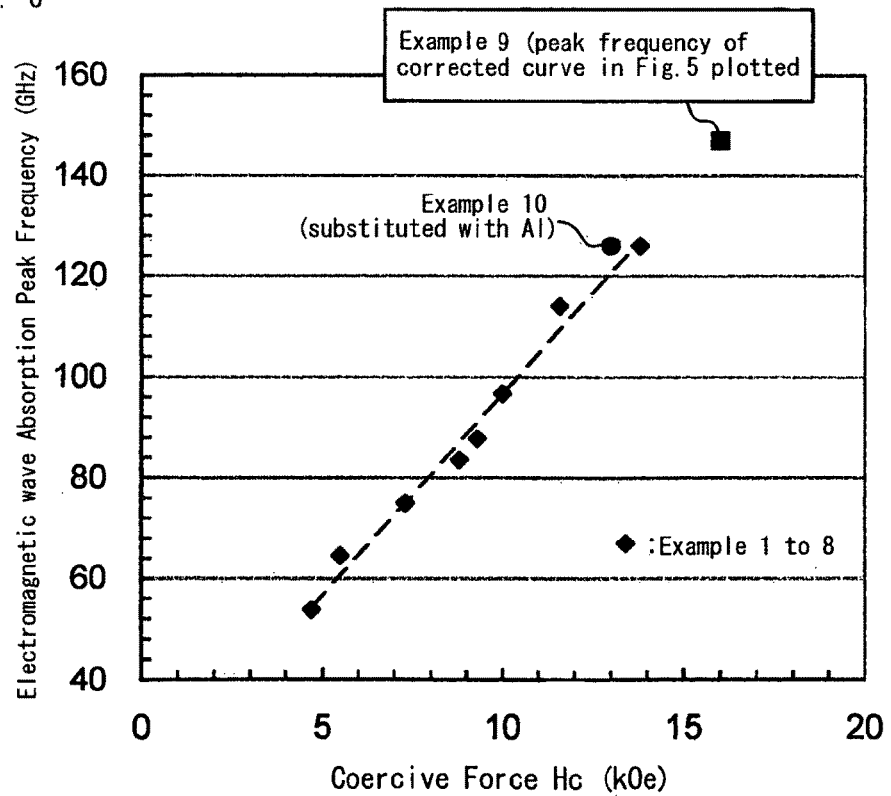
FIG. 6 is a graph showing the relationship between the coercive force and the electromagnetic wave absorption peak frequency of M-substituted $\epsilon$-$Fe_2O_3$ crystals.

FIG. 6 shows the relationship between the coercive force Hc and the electromagnetic wave absorption peak frequency. As seen from the found data, as plotted therein, of the samples of Examples 1 to 8 and 10, the coercive force Hc and the electromagnetic wave absorption peak frequency have a linear correlation. Regarding Example 9, the correlation between the found data of the coercive force Hc and the estimated data of the electromagnetic wave absorption peak frequency is plotted, and this is almost on the extension of the line of the found data. On the other hand, in case where the substituent element M is Ga, Al, In or the like, the coercive force Hc lowers with the increase in the value x in the molar ratio of M to Fe, M/Fe=x/(2−x) (or that is, with the increase in the degree of substitution with M) (see Table 2 and the Table 3 mentioned above). Accordingly, when the substituent element M of the type is used, then the electromagnetic wave absorption peak position can be accurately controlled at a desired frequency by changing the degree of substitution with M (that is, the value x). This point is one significant characteristic feature of the M-substituted $\epsilon$-$Fe_2O_3$ crystal. By controlling the degree of substitution with Ga, Al, In or the like, it is sufficiently possible to construct an electromagnetic wave absorber having an electromagnetic wave absorption peak at around 160 GHz, and this is supported by the estimated results of Example 9 mentioned above. As in FIG. 2(a) and FIG. 2(b), it is apparent that the electromagnetic wave absorber samples express an electromagnetic wave absorbing phenomenon broadly even in a frequency region deviating from the peak. This electromagnetic wave absorbing behavior is peculiar to M-substituted $\epsilon$-$Fe_2O_3$ crystals. In Example 1 in FIG. 2(a), the curve is cut at around the peak, and this is caused by antenna change operation.

Control Example

This Example is for demonstrating the production of an $\epsilon$-$Fe_2O_3$ composition, to which a substituent element M is not added.

This differs from Example 1 in the following points.

[1] In the step 1, the amount of iron(III) nitrate 9-hydrate used in preparing the micelle solution I was changed from 0.002295 mol to 0.0030 mol, and gallium(III) nitrate n-hydrate was not added.

[2] In the step 1, 0.00030 mol of barium was added as a morphology controlling agent in preparing the micelle solution I.

[3] In the step 3, the amount of tetraethoxysilane (TEOS) added was 6 mL.

[4] In the step 5, the baking temperature was 1000° C.

The others than the above were the same as in the process of Example 1. Regarding the feeing composition, the molar ratio of Ga to Fe is Ga/Fe=x/(2−x) with x=0.

Figure 3J:
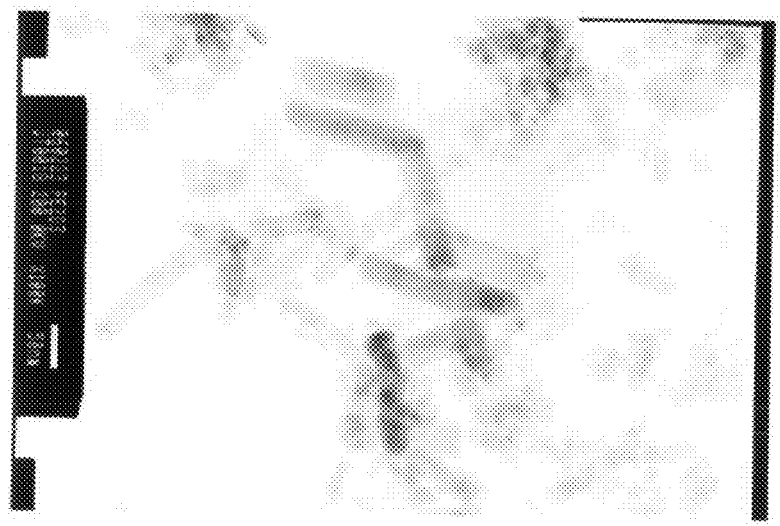
FIG. 3(j) is a TEM picture of the powder obtained in Control Example.
Figure 3K:
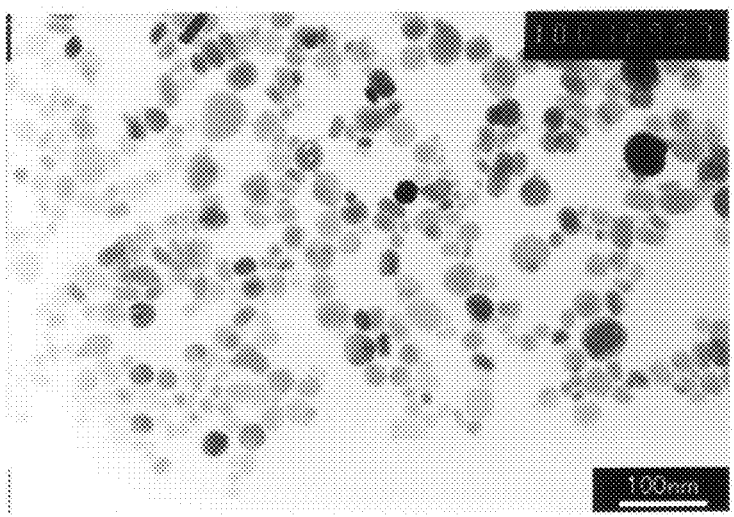
FIG. 3(k) is a TEM picture of the powder obtained in Example 10.

A TEM picture of the powder is shown in FIG. 3(j). The TEM mean particle size was 34.8 nm, the standard deviation was 28.9 nm, and the fluctuation coefficient was 83.1%.

Figure 1B:
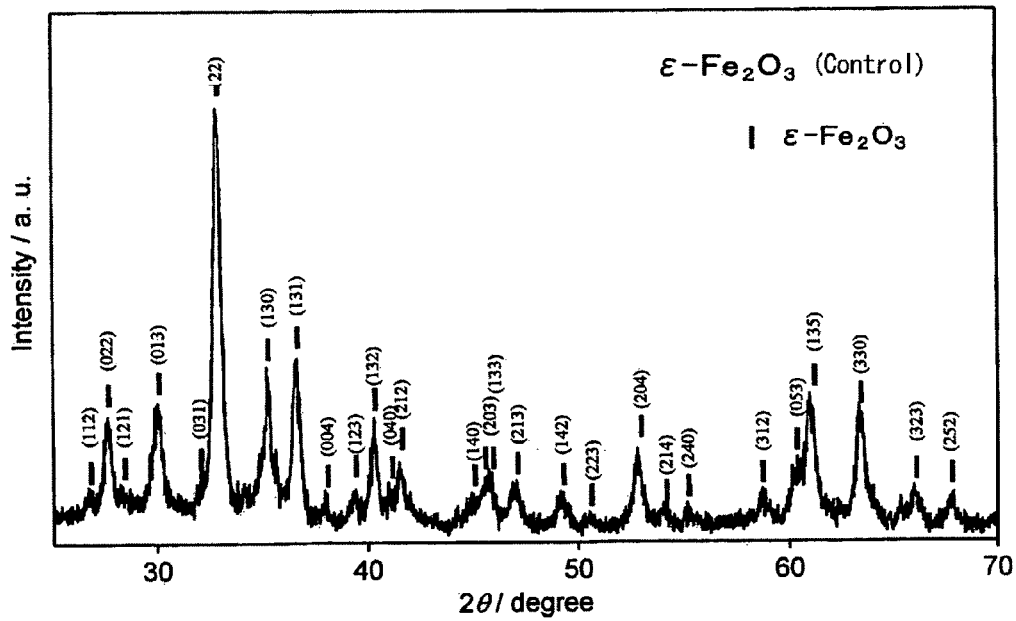
FIG. 1(b) is an X-ray diffraction pattern of a powder obtained in Control Example.

The obtained sample was analyzed through X-ray diffraction in the same manner as in Example 1, which gave a diffraction pattern shown in FIG. 1(b). In the diffraction pattern, no other than the peaks corresponding to the crystal structure of $\epsilon$-Fe$_2$O$_3$ (ortho rhombic system, space group Pna2$_1$) was detected.

The obtained sample was analyzed for determining its magnetic hysteresis loop at room temperature (300K) in the same manner as in Example 1. However, the magnetic field given to the sample was 50 kOe (3.98×10$^6$ A/m). The result is shown in FIG. 4(b). Under the test condition of the magnetic field of 50 kOe (3.98×10$^6$ A/m), the coercive force was 19.7 kOe (1.57×10$^6$ A/m), and the saturation magnetization was 12.0 emu/g (A·m$^2$/kg).

Next, a quartz-made sample case capable of holding therein a powder in the form of a column having a diameter of 46.8 mm and a thickness of 10 mm was prepared, and 16.3 g of the sample powder was filled in the sample case to thereby form a columnar packed structure having a diameter of 46.8 mm and a thickness of 10 mm. An electromagnetic wave absorber sample of the packed structure was analyzed for the electromagnetic wave absorbing characteristics thereof according to the same method as in Example 1. The results are shown in FIG. 2(a) and FIG. 2(b).

As known from FIG. 2(a) and FIG. 2(b), the electromagnetic wave absorber sample did not have an electromagnetic wave absorption peak within a range of 110 GHz or lower. Probably, it may have an electromagnetic wave absorption peak in a further higher frequency region.

TABLE 3

| Substituent Element M | | | | | |
|---|---|---|---|---|---|
| Ga | | Al | | In | |
| x | Hc (kOe) | x | Hc (kOe) | x | Hc (kOe) |
| 0.10 | 16.0 | 0.21 | 14.0 | 0.12 | 14.0 |
| 0.15 | 13.8 | 0.30 | 13.0 | 0.24 | 9.0 |
| 0.23 | 11.6 | 0.34 | 11.6 | | |
| 0.30 | 10.0 | 0.37 | 11.1 | | |
| 0.35 | 9.3 | 0.45 | 9.7 | | |
| 0.40 | 8.8 | 0.56 | 7.6 | | |
| 0.47 | 7.3 | 0.76 | 3.6 | | |
| 0.54 | 5.5 | | | | |
| 0.63 | 4.7 | | | | |

The invention claimed is:

1. A magnetic crystal for use in an electromagnetic wave absorbing materials having absorbing capability in a high frequency band of 25 to 160 GHZ, the magnetic crystal having a structure of $\epsilon$-M$_x$Fe$_{2-x}$O$_3$ with 0<x<1, and further having the same space group as that of an $\epsilon$-Fe$_2$O$_3$ crystal and in which M is substituted for a portion of the Fe sites of the $\epsilon$-Fe$_2$O$_3$ crystal;

wherein M is a trivalent element having an effect of lowering a coercive force Hc of the magnetic oxide comprising an $\epsilon$-Fe$_2$O$_3$ crystal when M is substituted for a portion of the Fe sites of the $\epsilon$-Fe$_2$O$_3$ crystal.

2. The magnetic crystal as claimed in claim 1, wherein M is at least one of the Al, Ga and In.

3. The magnetic crystal as claimed in claim 1, wherein M is Al and x is from 0.2 to 0.8.

4. The magnetic crystal as claimed in claim 1, wherein M is Ga and x is from 0.1 to 0.8.

5. The magnetic crystal as claimed in claim 1, wherein M is In and x is from 0.01 to 0.3.

6. An electromagnetic wave absorbing material comprising a powder of particles having the magnetic crystal of claim 1 as a magnetic phase.

7. An electromagnetic wave absorber having a packed structure of particles having the magnetic crystal of claim 1 as a magnetic phase.

8. An electromagnetic wave absorber having a packed structure of particles having the magnetic crystal of claim 1 as a magnetic phase, and having an electromagnetic wave absorption peak in a band zone of from 25 to 160 GHz on a graph in which the horizontal axis indicates a frequency and the vertical axis indicates an electromagnetic wave absorption.

9. An electromagnetic wave absorber having a packed structure of particles having the magnetic crystal of claim 1 as a magnetic phase, and having an electromagnetic wave absorption peak in a band zone of 76 GHz±10 GHz on a graph in which the horizontal axis indicates a frequency and the vertical axis indicates an electromagnetic wave absorption.

10. An electromagnetic wave absorber produced by binding particles having the magnetic crystal of claim 1 as a magnetic phase with a non-magnetic high-molecular compound serving as a binder, thereby forming a packed structure of the particles.

11. An electromagnetic wave absorber having a packed structure of particles having the magnetic crystal of claim 1 where M is Ga and x is from 0.1 to 0.65 as a magnetic phase, and having an electromagnetic wave absorption peak in a band zone of from 50 to 160 GHz on a graph in which the horizontal axis indicates a frequency and the vertical axis indicates an electromagnetic wave absorption.

12. An electromagnetic wave absorber having a packed structure of particles having the magnetic crystal of claim 1 where M is Al and x is from 0.2 to 0.8 as a magnetic phase, and having an electromagnetic wave absorption peak in a band zone of from 40 to 160 GHz on a graph in which the horizontal axis indicates a frequency and the vertical axis indicates an electromagnetic wave absorption.

* * * * *